United States Patent
Jung

(10) Patent No.: US 7,843,245 B2
(45) Date of Patent: Nov. 30, 2010

(54) REFERENCE VOLTAGE GENERATING CIRCUIT AND OFFSET-COMPENSATED CURRENT-VOLTAGE CONVERTING CIRCUIT USING THE SAME

(75) Inventor: Ha Woong Jung, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 181 days.

(21) Appl. No.: 12/178,385

(22) Filed: Jul. 23, 2008

(65) Prior Publication Data
US 2009/0027113 A1    Jan. 29, 2009

(30) Foreign Application Priority Data
Jul. 24, 2007    (KR) .................... 10-2007-0073997

(51) Int. Cl.
*H03L 5/00*    (2006.01)
(52) U.S. Cl. .................. 327/307; 327/538; 327/103
(58) Field of Classification Search .............. 327/103, 327/307, 530, 538, 540, 541
See application file for complete search history.

(56) References Cited

U.S. PATENT DOCUMENTS 6,677,809 B2 *   1/2004   Perque et al. .............. 327/541
7,002,401 B2 *   2/2006   Khalid ...................... 327/541

FOREIGN PATENT DOCUMENTS

JP    2002-009560 A    1/2002
KR    10-2006-0093898 A    8/2006

* cited by examiner

*Primary Examiner*—Quan Tra
(74) *Attorney, Agent, or Firm*—Lowe Hauptman Ham & Berner, LLP

(57) ABSTRACT

There is provided a reference voltage generating circuit generating a reference voltage to be applied to a current-to-voltage converting circuit in order to compensate for an offset voltage of the current-to-voltage converting circuit converting an input current into a voltage and outputting the voltage, the reference voltage generating circuit including: a sampling conversion circuit having the same circuit characteristics as the current-to-voltage converting circuit and adding a predetermined offset to the reference voltage to generate an output voltage; and a comparator controlling the reference voltage so that the output voltage of the sampling conversion circuit is equal to a predetermined voltage, wherein the reference voltage is applied as an input to the sampling conversion circuit.

8 Claims, 4 Drawing Sheets

REFERENCE VOLTAGE GENERATING CIRCUIT AND OFFSET-COMPENSATED CURRENT-VOLTAGE CONVERTING CIRCUIT USING THE SAME

CROSS-REFERENCE TO RELATED APPLICATIONS

This application claims the priority of Korean Patent Application No. 2007-0073997 filed on Jul. 24, 2007, in the Korean Intellectual Property Office, the disclosure of which is incorporated herein by reference.

BACKGROUND OF THE INVENTION

1. Field of the Invention

The present invention relates to an offset compensation circuit, and more particularly, to a circuit that can compensate for an offset value by inputting to the current-to-voltage converting circuit, a corrected reference voltage in which an offset value that may occur in the current-to-voltage converting circuit is reflected.

2. Description of the Related Art

In a photo diode integrated circuit (PDIC), an offset voltage is generated due to a physical device size mismatch, a current flowing through both input terminals of a current-to-voltage converter, and a leakage current occurring in a feedback resistor.

In the related art, in order to compensate for the offset voltage, a method of compensating the offset voltage by using a compensation resistor is used to reduce the amount of offset current flowing through the input terminals of the current-to-voltage converter.

FIG. 1 is a schematic view illustrating a current-to-voltage converting circuit according to the related art.

Referring to FIG. 1, a current-to-voltage converting circuit 100 according to the related art may include a photo diode integrated circuit 140, an amplifier 130, and a compensation resistor 110.

An output voltage $V_O$ of the circuit is obtained by the following Equation.

$$V_O = i_p R_f + V_{REF} + [(I_{B-})R_f - (I_{B+})R_C]$$

The output voltage $V_O$ may be calculated on the basis of a voltage $i_p R_f$ obtained by using photocurrent ip generated by an external light source and a feedback resistor $R_f$, a reference voltage $V_{ref}$, and an offset voltage $I_b - R_f$ generated by leakage current generated from the feedback resistor $R_f$.

In order to compensate for the offset voltage, in the related art, the compensation resistor $R_c$ is used to reduce the amount of offset current flowing through input terminals of the current-to-voltage converting circuit. In this way, the offset voltage is compensated.

However, according to the related art, the size of the compensation resistor $R_c$ may be changed during a semiconductor process, and the voltage between both terminals of the photo diode may be changed to generate a new offset error.

SUMMARY OF THE INVENTION

An aspect of the present invention provides a circuit that can compensate for offset by controlling a reference voltage despite variation in physical device size and a change in environment.

According to an aspect of the present invention, there is provided a reference voltage generating circuit generating a reference voltage to be applied to a current-to-voltage converting circuit in order to compensate for an offset voltage of the current-to-voltage converting circuit converting an input current into a voltage and outputting the voltage, the reference voltage generating circuit including: a sampling conversion circuit having the same circuit characteristics as the current-to-voltage converting circuit and adding a predetermined offset to the reference voltage to generate an output voltage; and a comparator controlling the reference voltage so that the output voltage of the sampling conversion circuit is equal to a predetermined voltage, wherein the reference voltage is applied as an input to the sampling conversion circuit.

The sampling conversion circuit may include an operational amplifier having the same offset as the current-to-voltage converting circuit.

The sampling conversion circuit may include an operational amplifier having a non-inverted input terminal to which the reference voltage is input and an inverted input terminal to which the output voltage of the sampling conversion circuit is fed back.

The comparator may include an operational amplifier having an inverted input terminal to which the output voltage of the sampling conversion circuit is input and a non-inverted input terminal to which the predetermined voltage is input.

The comparator may further include filters.

According to another aspect of the present invention, there is provided a current-to-voltage converting circuit including: a current-to-voltage converting circuit converting an input current into a voltage and outputting the voltage; a sampling conversion circuit having the same circuit characteristics as the current-to-voltage converting circuit and adding a predetermined offset to a reference voltage to generate an output voltage; and a comparator controlling the reference voltage so that the output voltage of the sampling conversion circuit is equal to the predetermined voltage, wherein the reference voltage is applied as an input to the current-to-voltage converting circuit and the sampling conversion circuit to remove offset in the current-to-voltage converting circuit.

The current input to the current-to-voltage converting circuit may be a current generated by a photo diode.

The current-to-voltage converting circuit may include an operational amplifier having a non-inverted input terminal to which the reference voltage is input and an inverted input terminal to which the input current and the fed-back output voltage of the current-to-voltage converting circuit are input.

The sampling conversion circuit may include an operational amplifier having the same offset as the current-to-voltage converting circuit.

The sampling conversion circuit may include an operational amplifier having a non-inverted input terminal to which the reference voltage is input and an inverted input terminal to which the output voltage of the sampling conversion circuit is fed back.

The comparator may include an operational amplifier having an inverted input terminal to which the output voltage of the sampling conversion circuit is input and a non-inverted input terminal to which the predetermined voltage is input.

The comparator may further include filters.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
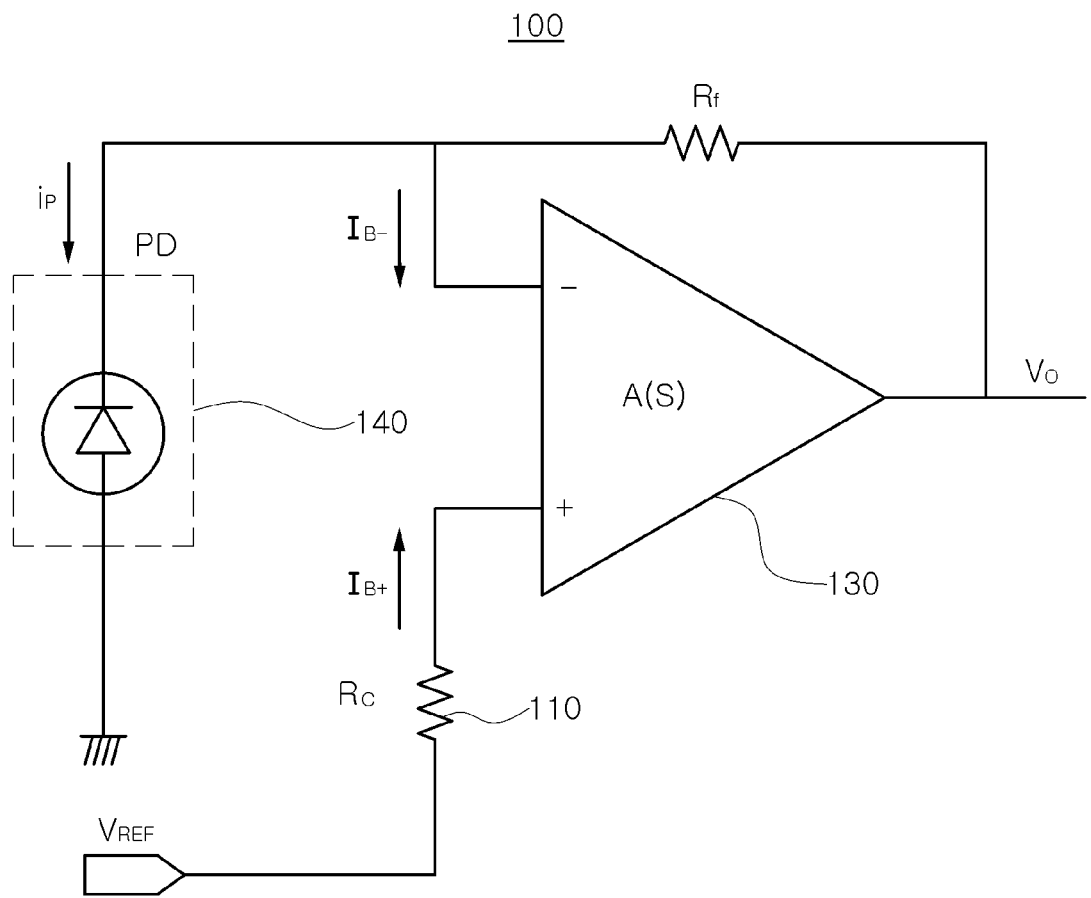
FIG. 1 is a configuration view illustrating a current-to-voltage converting circuit according to the related art.
Figure 2:
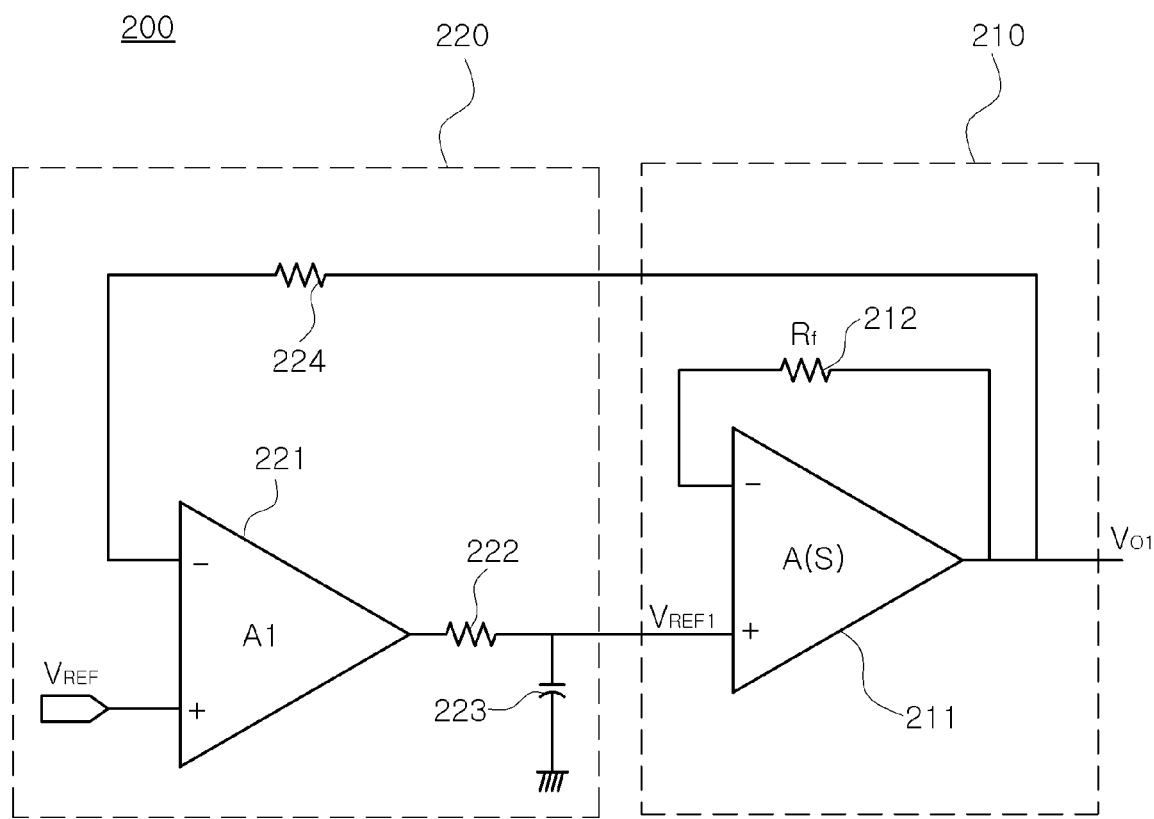
FIG. 2 is a configuration view illustrating a reference voltage generating circuit according to an exemplary embodiment of the present invention.

FIG. 2 is a schematic view illustrating a reference voltage generating circuit according to an exemplary embodiment of the present invention.

Referring to FIG. 2, a reference voltage generating circuit 200 according to this embodiment may include a sampling conversion circuit 210 and a comparator 220.

The sampling conversion circuit 210 may include an operational amplifier 211 and a feedback resistor 212. The sampling conversion circuit 210 may have the same circuit characteristics as a current-to-voltage converting circuit to which the reference voltage generating circuit 200 according to this embodiment is connected.

The comparator 220 may include an operational amplifier 221 and filters 222 and 223.

The operational amplifier 211 of the sampling conversion circuit 210 may receive a corrected reference voltage $V_{REF1}$ through a non-inverted terminal thereof and provide an output voltage $V_{o1}$ of the operational amplifier 211 as inversion input to the operational amplifier 221 of the comparator 220. The output voltage $V_{o1}$ of the operational amplifier 211 of the sampling conversion circuit may be fed back through the feedback resistor 212 into an inverted input terminal of the operational amplifier 211.

In the operational amplifier 221 of the comparator 220, a predetermined voltage $V_{REF}$ is input to a non-inverted input terminal, and the output voltage $V_{o1}$ of the sampling conversion circuit may be input to a non-inverted input terminal.

Filters formed of a resistor 222 and a capacitor 223 may be connected to an output terminal of the operational amplifier 221 of the comparator 220. The filters can filter a signal that is output from the operational amplifier 221 of the comparator 220.

The output signal of the comparator 220 becomes the corrected reference voltage $V_{REF1}$, and the corrected reference voltage $V_{REF1}$ may be provided to the current-to-voltage converting circuit.

At this time, when an offset voltage $V_{os}$ is generated in the operational amplifier 211 of the sampling conversion circuit 210, the output voltage $V_{o1}$ of the sampling conversion circuit 210 is represented by the following Equation 1.

$$V_{o1} = V_{os} + V_{REF1} \quad \text{[Equation 1]}$$

The output voltage $V_{o1}$ of the sampling conversion circuit 210 may be fed back to an inverted input terminal of the operational amplifier 221 of the comparator 220. The comparator 220 makes the output voltage $V_{o1}$ input from the sampling conversion circuit 210 equal to the predetermined voltage $V_{ref}$ to thereby output the reference voltage $V_{ref1}$.

Therefore, when characteristics of the operational amplifier 221 of the comparator 220 are used, the fed-back output voltage $V_{o1}$ of the sampling conversion circuit 210 can be represented by the following Equation 2.

$$V_{o1} = V_{REF} \quad \text{[Equation 2]}$$

By using the above-described Equations 1 and 2, the following equation can be obtained.

$$V_{REF1} = V_{REF} - V_{os}$$

That is, the reference voltage $V_{REF1}$ that is input to the current-to-voltage converting circuit is obtained by subtracting the offset voltage $V_{os}$ of the sampling conversion circuit 210 from the predetermined voltage $V_{REF}$.

Figure 3:
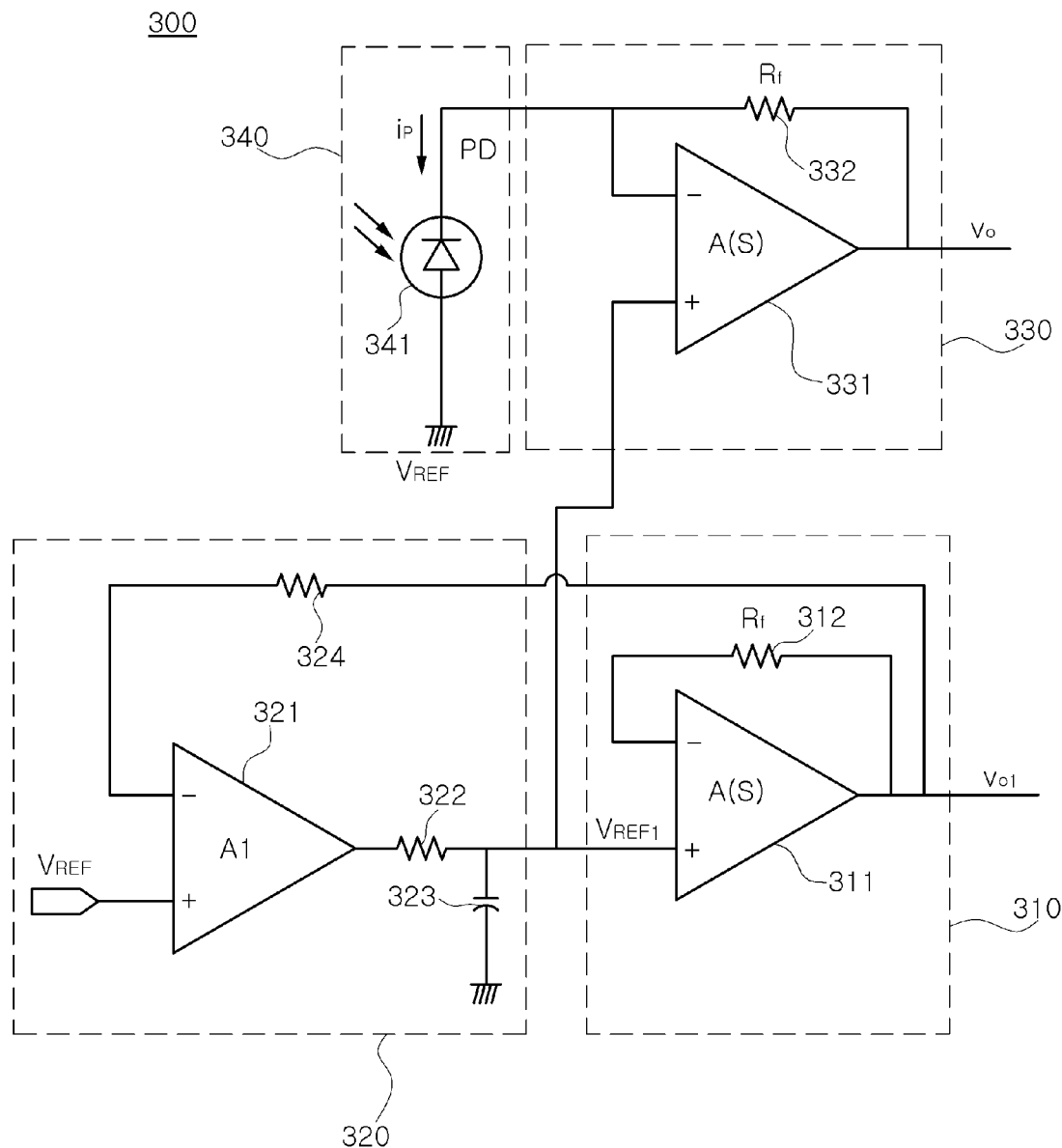
FIG. 3 is a configuration view illustrating an offset compensated current-to-voltage converting circuit according to another exemplary embodiment of the present invention.

FIG. 3 is a schematic view illustrating an offset-compensated current-to-voltage converting circuit according to another exemplary embodiment of the present invention.

Referring to FIG. 3, an offset-compensated current-to-voltage converting circuit 300 according to this embodiment may include a current-to-voltage converting circuit 330, a sampling conversion circuit 310, and a comparator 320.

The current-to-voltage converting circuit 330 may include an operational amplifier 331 that receives a reference voltage $V_{REF1}$ through a non-inverted input terminal thereof and an input current and an output voltage $V_o$ through an inverted input terminal thereof.

The input current that is input to the current-to-voltage converting circuit 330 may be a current generated by a photo diode 341. The photo diode 341 is a kind of photoelectric converter that can generate a current in response to light irradiation by using a p-n junction formed between p-type and n-type semiconductors or a metal having a rectifying effect and a semiconductor.

The sampling conversion circuit 310 may include an operational amplifier 311 and a feedback resistor $R_f$. The sampling conversion circuit 310 may have the same circuit characteristics as the current-to-voltage converting circuit 330.

The comparator 320 may include an operational amplifier 321 and filters 322 and 323.

The operational amplifier 311 of the sampling conversion circuit 310 may receive the reference voltage $V_{REF1}$ through a non-inverted input terminal and provide an output voltage $V_{o1}$ as an input to an inverted terminal of the operational amplifier 321 of the comparator 320. The output voltage $V_{o1}$ of the operational amplifier 311 of the sampling conversion circuit 310 may be fed back through the feedback resistor 312 into an inverted input terminal of the operational amplifier 311.

The operational amplifier 321 of the comparator 320 has the non-inverted input terminal to which the predetermined voltage $V_{REF}$ is input and the inverted input terminal to which the output voltage $V_{o1}$ of the sampling conversion circuit 310 is input.

The filters formed of the resistor 322 and the capacitor 323 may be connected to an output terminal of the operational amplifier 321 of the comparator 320. The filters can filter a signal that is output from the operational amplifier 321 of the comparator 320.

The output signal of the comparator 320 becomes the reference voltage $V_{REF1}$. The reference voltage $V_{REF1}$ may be provided to the current-to-voltage converting circuit 330.

Here, when an offset voltage $V_{os}$ is generated in the operational amplifier 311 of the sampling conversion circuit 310, the output voltage $V_{o1}$ of the sampling conversion circuit 310 can be represented by the following Equation 3.

$$V_{o1} = V_{os} + V_{REF1} \quad \text{[Equation 3]}$$

The output voltage $V_{o1}$ of the sampling conversion circuit 310 is fed back into the inverted input terminal of the operational amplifier 321 of the comparator 320. Therefore, when characteristics of the operational amplifier 321 of the comparator 320 are used, the fed-back output voltage $V_{o1}$ of the sampling conversion circuit 310 can be represented by the following Equation 4.

$$V_{o1} = V_{REF} \quad [\text{Equation 4}]$$

By using the above-described Equations 3 and 4, the following equation can be obtained.

$$V_{REF1} = V_{REF} - V_{os}$$

That is, the reference voltage $V_{REF1}$ that is input to the current-to-voltage converting circuit 330 and the sampling conversion circuit 310 is obtained by subtracting the offset voltage $V_{os}$ of the sampling conversion circuit 310 from the predetermined voltage $V_{REF}$.

In this embodiment, an offset value that has the same size as an offset value that may be generated in the current-to-voltage converting circuit 330 is obtained in advance by the sampling conversion circuit 310. The reference voltage $V_{REF1}$ obtained by subtracting the offset value, obtained by the sampling conversion circuit 310, from the predetermined voltage $V_{REF}$ is provided to the current-to-voltage converting circuit 330. In this way, it is possible to compensate for offset in the current-to-voltage converting circuit 330.

FIGS. 4A to 4D are graphs each illustrating a comparison between an offset value of a current-to-voltage converting circuit according to the related art and an offset value of an offset-compensated current-to-voltage converting circuit according to an exemplary embodiment of the present invention.

Figure 4A:
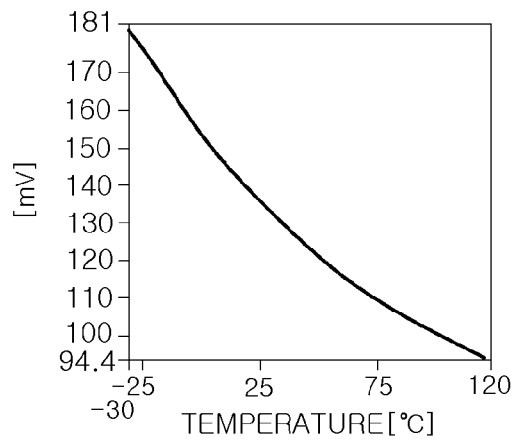
FIGS. 4A to 4D are graphs illustrating changes in offset values according to a temperature change and processes in a current-to-voltage converting circuit according to the related art and a current-to-voltage converting circuit according to an exemplary embodiment of the present invention.
Figure 4B:
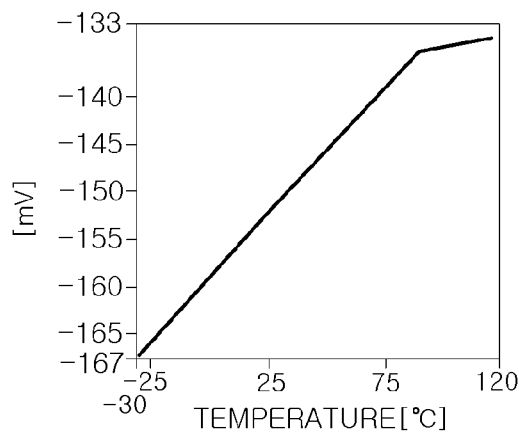
Figure 4C:
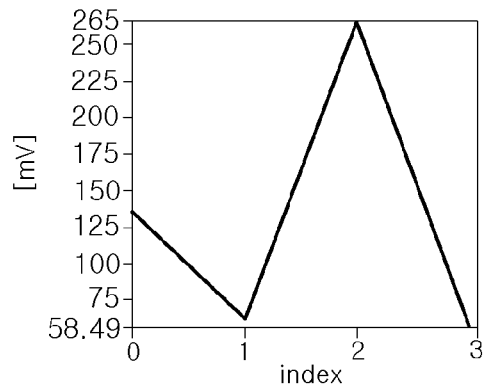
Figure 4D:
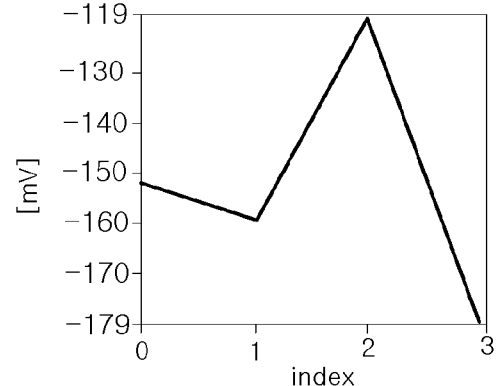

In FIGS. 4A and 4B, a change in offset value according to a change in temperature is shown. In FIGS. 4C and 4D, offset value according to a manufacturing process is shown.

Referring to FIGS. 4A and 4B, while the temperature increases from −30 to 120 degrees, the offset value of the current-to-voltage converting circuit according to the related art changes from approximately 181 mV to approximately 94.4 mV. That is, the change in the offset value is approximately 86 mV. On the other hand, the offset-compensated current-to-voltage converting circuit according to the embodiment of the invention changes from approximately −167 μN to approximately −133 μN. That is, the change in the offset value is approximately 34 μN.

Referring to FIGS. 4C and 4D, a transistor that forms the current-to-voltage converting circuit is manufactured according to index 1 to 3. Here, in the related art, the offset value changes from approximately 58.4 mV to approximately 265 mV, and thus the change is approximately 206 mV. On the other hand, in the embodiment of the invention, the offset value changes from approximately −179 μN to approximately −119 μN, and thus the change is approximately 60 μN.

Therefore, as compared when the current-to-voltage converting circuit according to the related art controls the offset by using a resistor, the offset value is significantly compensated by using the reference voltage generating circuit according to the embodiment of the invention.

As set forth above, according to the exemplary embodiments of the invention, it is possible to reduce an offset that may occur due to a change in temperature during a manufacturing process in a current-to-voltage converting circuit.

While the present invention has been shown and described in connection with the exemplary embodiments, it will be apparent to those skilled in the art that modifications and variations can be made without departing from the spirit and scope of the invention as defined by the appended claims.

What is claimed is:

1. A reference voltage generating circuit generating a reference voltage to be applied to a current-to-voltage converting circuit in order to compensate for an offset voltage of the current-to-voltage converting circuit converting an input current into a voltage and outputting the voltage, the reference voltage generating circuit comprising:

a sampling conversion circuit having the same circuit characteristics as the current-to-voltage converting circuit and adding a predetermined offset to the reference voltage to generate an output voltage; and a comparator controlling the reference voltage so that the output voltage of the sampling conversion circuit is equal to a predetermined voltage, wherein the reference voltage is applied as an input to the sampling conversion circuit; and wherein the sampling conversion circuit comprises an operational amplifier having the same offset as the current-to-voltage converting circuit.

2. The reference voltage generating circuit of claim 1, wherein the sampling conversion circuit comprises an operational amplifier having a non-inverted input terminal to which the reference voltage is input and an inverted input terminal to which the output voltage of the sampling conversion circuit is fed back.

3. The reference voltage generating circuit of claim 1, wherein the comparator comprises an operational amplifier having an inverted input terminal to which the output voltage of the sampling conversion circuit is input and a non-inverted input terminal to which the predetermined voltage is input.

4. A current-to-voltage converting circuit comprising:

a current-to-voltage converting circuit converting an input current into a voltage and outputting the voltage;

a sampling conversion circuit having the same circuit characteristics as the current-to-voltage converting circuit and adding a predetermined offset to a reference voltage to generate an output voltage; and a comparator controlling the reference voltage so that the output voltage of the sampling conversion circuit is equal to the predetermined voltage, wherein the reference voltage is applied as an input to the current-to-voltage converting circuit and the sampling conversion circuit to remove offset in the current-to-voltage converting circuit; and wherein the sampling conversion circuit comprises an operational amplifier having the same offset as the current-to-voltage converting circuit.

5. The current-to-voltage converting circuit of claim 4, wherein the current input to the current-to-voltage converting circuit is a current generated by a photo diode.

6. The current-to-voltage converting circuit of claim 4, wherein the current-to-voltage converting circuit comprises an operational amplifier having a non-inverted input terminal to which the reference voltage is input and an inverted input terminal to which the input current and the fed-back output voltage of the current-to-voltage converting circuit are input.

7. The current-to-voltage converting circuit of claim 4, wherein the sampling conversion circuit comprises an operational amplifier having a non-inverted input terminal to which the reference voltage is input and an inverted input terminal to which the output voltage of the sampling conversion circuit is fed back.

8. The current-to-voltage converting circuit of claim 4, wherein the comparator comprises an operational amplifier having an inverted input terminal to which the output voltage of the sampling conversion circuit is input and a non-inverted input terminal to which the predetermined voltage is input.

* * * * *